Figure 1:
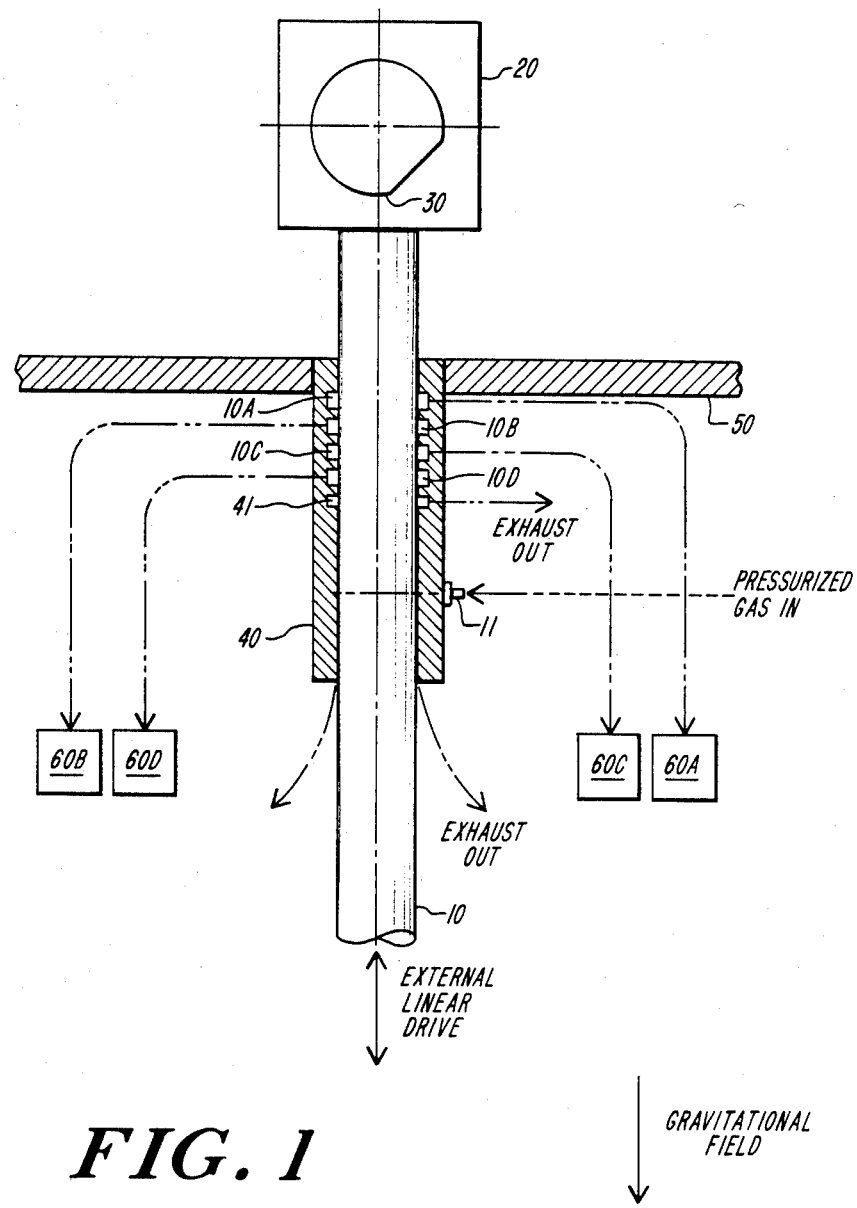

United States Patent [19]

Pollock

[11] Patent Number: 4,726,689
[45] Date of Patent: Feb. 23, 1988

[54] LINEAR GAS BEARING WITH INTEGRAL VACUUM SEAL FOR USE IN SERIAL PROCESS ION IMPLANTATION EQUIPMENT

[75] Inventor: John D. Pollock, Rowley, Mass.

[73] Assignee: Eclipse Ion Technology, Inc., Gloucester, Mass.

[21] Appl. No.: 921,435

[22] Filed: Oct. 22, 1986

[51] Int. Cl.$^4$ .................. F16C 32/06; F16C 33/72; F16J 15/16; F16J 15/40

[52] U.S. Cl. ........................... 384/12; 277/3; 277/71; 277/79; 384/16; 384/100; 384/114; 384/132

[58] Field of Search .................. 384/12, 15, 16, 100, 384/114, 131, 132, 134; 277/3, 70, 71, 72 R, 79

[56] References Cited

U.S. PATENT DOCUMENTS

| | | | |
|---|---|---|---|
| 2,899,245 | 8/1959 | Michel | 384/132 |
| 2,908,515 | 10/1959 | Schellens | 277/3 |
| 3,734,580 | 5/1973 | Piscitelli | 384/131 |
| 3,949,996 | 4/1976 | Inoue et al. | 384/132 X |
| 4,014,555 | 3/1977 | Jacottet | 277/3 |
| 4,118,042 | 10/1978 | Booth | 277/3 X |
| 4,191,385 | 3/1980 | Fox et al. | 277/3 |
| 4,361,332 | 11/1982 | Logan et al. | 277/3 |
| 4,544,317 | 10/1985 | Carter | 277/3 X |

Primary Examiner—Stuart S. Levy
Assistant Examiner—Thomas R. Hannon
Attorney, Agent, or Firm—Lahive & Cockfield

[57] ABSTRACT

A high vacuum ion implantation chamber has a lower wall formed with an opening accommodating a depending sleeve through which a shaft passes supporting a substrate support platform at the top and connectable to external linear and rotary drives at the bottom. The sleeve is formed with four axially spaced annular grooves each coupled to a respective vacuum pump that maintains the annular grooves at respective pressures that progressively increase for grooves further away from the vacuum chamber bottom wall. A lowermost annular groove functions as an exhaust along with the region surrounding the shaft at the bottom of the sleeve. The sleeve also includes an air inlet. The gravity forces acting upon the shaft and platform assembly are counterbalanced by the differential pressure acting over the shaft area between the high vacuum chamber and the ambient surroundings.

10 Claims, 2 Drawing Figures

LINEAR GAS BEARING WITH INTEGRAL VACUUM SEAL FOR USE IN SERIAL PROCESS ION IMPLANTATION EQUIPMENT

The present invention relates in general to gas bearings and more particularly concerns a novel linear gas bearing with an integral vacuum seal for use in serial process ion implantation equipment. The bearing is characterized by low friction, low particulate generation, and ability to maintain a good vacuum seal.

Gas bearings are known in the art and are commercially available in a variety of styles, shapes and sizes. The common types of gas bearings are rotary, single axis linear and dual axis planar.

Use of "differential pumping" to obtain pressure gradients between ambient and high vacuum environments is also known in the art. The most common configuration employs two back to back mechanical seals of either natural or synthetic rubber with a differential pressure maintained between them with respect to the environment on either side of the seal pair. Successful sealing of high vacuum to atmosphere has also been demonstrated by differentially pumping on grooves without mechanical seals installed in them, relying on the resistance of flow thru small geometries between grooves as the "sealing mechanism".

The present invention relates to a combination of the techniques of gas bearings and differential pumping and in particular, to the use in ion implant equipment of a radial gas bearing with an integral, differentially pumped, "empty groove", type seal to obtain vacuum sealed, rotary and/or linear motion.

To date, two general types of ion implant systems have evolved to meet the fundamental needs of semiconductor manufacturing. The "batch process" line of equipment is normally associated with higher dose implants and most typically accomplishes ion beam scanning into substrates by some combination of magnetic beam deflection and/or substrate mechanical scanning. In most, if not all, "batch" systems a number of substrates are sequentially passed through the ion beam at a relatively high rate of speed in at least one of the two scan axes.

On the other hand, the "serial process" line of ion implant equipment is normally associated with medium dose implants and most typically accomplishes ion beam scanning by electrostatic beam deflection in both axes, with a single substrate held stationary at the target plane. These electrostatic deflection systems produce a scanned beam with trajectories which vary in angle of incidence across the diameter of the substrate; some by as much as 3°. Such variations in incident angle produce undesirable effects with respect to the ion implant process.

A means for producing a parallel scanned beam is described in pending application Ser. No. 06/849,786 filed Apr. 9, 1986, entitled ION BEAM FAST PARALLEL SCANNING owned by the assignee of this application. The ion beam is rendered parallel in one axis of scan utilizing electrostatic and magnetic devices while a second axis of scan is achieved by linearly translating the substrate fully through and past the scanned beam a number of times in a path normal to these ion trajectories and at a constant velocity.

The present invention provides low friction, low particulates, low noise, and high stiffness guidance to a substrate support shaft while maintaining a high differential pressure between the evacuated process chamber and the ambient environment which surrounds it.

An important object of this invention is to provide a linear gas bearing which locates and guides the mechanical scan shaft with virtually no friction forces and provides a means for achieving a dynamic, non-contact high vacuum seal between the ambient environment, within which the gas bearing itself resides, and the high vacuum environment within which the working end of the shaft resides.

Figure 2:
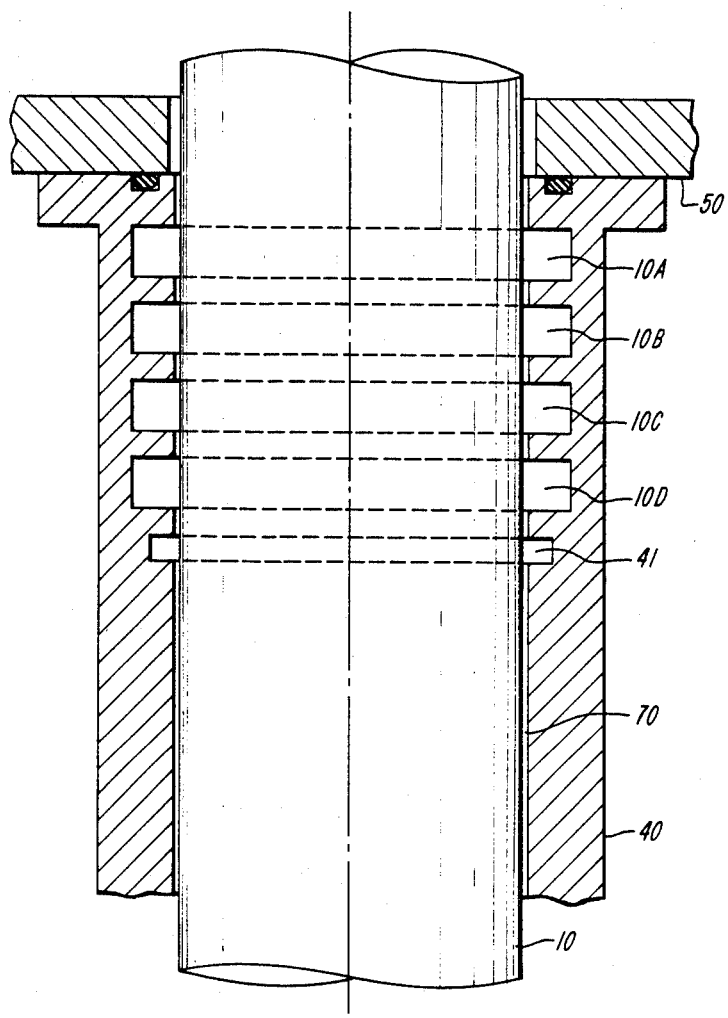

Numerous other features, objects and advantages of the invention will become apparent from the following specification when read in connection with the accompanying drawing in which:

FIG. 1 is a combined block pictorial representation partially in section of an exemplary embodiment of the invention; and FIG. 2 is a fragmentary enlarged view partially in section of a linear bearing according to the invention.

With reference now to the drawing and more particularly FIG. 1 thereof, there is shown a combined block-pictorial representation, partially in section, of an embodiment of the invention. The linear bearing includes a precision diameter shaft 10 with internal passage for fluids and rotary actuator (not shown) which act upon a platen 20 for maintaining desired substrate temperature and obtaining selected tilt angle of substrate 30 with respect to the ion beam (not shown). Precision diameter shaft 10 is housed within gas bearing assembly 40 which is rigidly mounted to underside of vacuum chamber 50. Shaft 10 passes through a multitude of internal grooves 10A-10D in the gas bearing assembly 40 whose respective pressures are differentially staged from atmospheric to near high vacuum levels and maintained by vacuum pumps 60A-60D, respectively. Both bearing and seal are non-contact with respect to reciprocating shaft 10 and thus provide for an essentially friction-free and noise-free linear motion vacuum feedthrough.

With mechanical scanning set up vertically as shown, gravity forces acting upon the free mass tend to pull the shaft/platen system downward. Differential pressure acting over the precision shaft area creates a counteracting force which tends to pull the shaft/platen system in the upward direction. Precision shaft diameter and moveable masses are selected such that a counterbalance of the opposing forces is achieved, leaving only forces required to accelerate and decelerate the moveable mass to be dealt with by the external drive system.

As indicated in FIG. 1 internal annular grooves 10A, 10B, 10C and 10D are maintained at progressively increasing pressures by vacuum pumps 60A, 60B, 60C and 60D, respectively, while pressurized gas enters at inlet 11 and exhausts at the bottom of assembly 40 and through annular groove 41.

Referring to FIG. 2, there is shown an enlarged fragmentary view of the linear bearing partially in section helpful in understanding principles of operation. A high stiffness gas film 70 is maintained between scan shaft 10 and gas bearing sleeve 40. Gas film exhausts into exhaust port 41 which is connected to the ambient surroundings via holes drilled radially outward through the gas bearing sleeve 40. A vacuum pump 60D is connected to pumping stage number 1 10D which establishes a pressure in said stage which is significantly lower than that of exhaust port 41. It can be shown by conventional fluid mechanics that this differential pressure promotes a flow of gas from port 41 to groove 10D which is proportional to the difference between the square of the upstream and downstream pressures, and also proportional to the cube of the gas film thickness. Since gas bearing film thicknesses are inherently very small (0.0005 inch or less), gas flow rates are also very small. This means that a relatively high differential pressure between adjacent ports can be achieved using a moderate size vacuum pump. A second vacuum pump 60C is connected to pumping stage number 2 10C; a third to pumping stage number 3 10B; and a fourth to pumping stage number 4 10A.

The four sequential pumping stages create a pressure gradient along the gas bearing linear axis, which decreases from ambient atmosphere to chamber high vacuum. The pressure in the fourth stage is maintained at a point where the gas flow rate to the high vacuum chamber is negligibly small. In order to minimize additional gas flow to the high vacuum chamber during scan shaft actuation, the pumped groove locations are axially spread out, within practical limits, to cover the maximum shaft length. In addition, the size of the grooves in the axial direction is maximized, within practical limits, to increase the dwell time of gas molecules within the groove boundaries.

There has been described novel apparatus and techniques for providing a linear gas bearing with an integral vacuum seal characterized by low friction, low particulates, and good sealing characteristics. It is evident that those skilled in the art may now make numerous uses and modifications of and departures from the specific apparatus and techniques herein disclosed without departing from the inventive concepts. Consequently, the invention is to be construed as embracing each and every novel feature and novel combination of features present in or possessed by the apparatus and techniques herein disclosed and limited by the spirit and scope of the appended claims.

What is claimed is:

1. A linear gas bearing comprising
   shaft means for coupling vertical linear movement from an external source to a platform located inside a high vacuum chamber having a chamber wall,
   sleeve means connected to said chamber wall for slidably accommodating said shaft means,
   said sleeve means being formed with a plurality of axially spaced grooves adjacent to said shaft means,
   vacuum pump means coupled to said grooves for establishing pressures in said grooves that progressively increase further from said high vacuum chamber, and
   means for maintaining a gas film between said shaft means and said sleeve means and interconnecting said grooves,
   whereby a non-contact seal is provided between said shaft means and said sleeve means, and
   wherein gravity forces acting on said shaft and platform are counterbalanced by the pressure difference between the high vacuum inside said high vacuum chamber and ambient pressure outside said high vacuum chamber acting on said shaft means.

2. A linear bearing in accordance with claim 1 wherein said sleeve means is formed with a gas inlet for receiving gas and exhaust outlets for exhausting gas for allowing a thin gas film to be established between said sleeve means and said shaft means to allow both linear and rotary movement of said shaft means relative to said sleeve means with negligible friction and low particulate generation.

3. A linear bearing in accordance with claim 1 wherein said vacuum pump means comprises a vacuum pump for each of said annular grooves,
   and means for coupling each of said vacuum pumps to a respective one of said annular grooves.

4. A linear bearing in accordance with claim 1 wherein said shaft means includes a shaft of a predetermined diameter.

5. A linear bearing in accordance with claim 1 wherein said vacuum pump means maintains a pressure in the one of the grooves closest to said high vacuum chamber such that the gas flow rate to said high vacuum chamber is negligibly small.

6. Apparatus comprising a high vacuum chamber having a chamber wall, a platen disposed within said high vacuum chamber, a shaft connected to said platen and extending through said chamber wall for generally vertical reciprocating movement with respect to said high vacuum chamber, a bearing including a bearing sleeve connected to said chamber for slidably receiving said shaft, said bearing forming a plurality of internal grooves axially spaced along said shaft, means for interconnecting said grooves with a gas film disposable between said shaft and said sleeve, vacuum pump means for establishing selected pressures in said grooves, and thereby forming a seal between said shaft and said sleeve while accommodating said relative movement therebetween, wherein ambient pressure acting on said shaft outside said high vacuum chamber and high vacuum acting on said platen and shaft within said high vacuum chamber form a differential pressure acting thereon selected such that said differential pressure creates a counteracting force which tends to pull said shaft and platen vertically upward so as to counterbalance gravity forces tending to pull said shaft and platen vertically downward.

7. A linear bearing system for ion implant equipment comprising a high precision shaft of predetermined diameter extending through a wall of a high vacuum chamber, a bearing sleeve connected externally to said chamber for slidably accommodating said shaft for linear, reciprocating movement with respect thereto, said bearing sleeve defining a plurality of internal annular grooves at successively lower respective pressures between atmospheric pressure and high vacuum levels, said grooves axially spaced along and adjacent said high precision shaft, vacuum pump means for establishing and maintaining said pressures in said grooves, and means for maintaining a gas film of preselected thickness between said precision diameter shaft and said bearing sleeve and interconnecting said grooves, and wherein the one of said grooves nearest said chamber being maintained at a pressure sufficient to set a flow of gas between said shaft and said bearing sleeve and into said chamber to negligible levels, whereby a non-contact seal is provided between said high precision shaft and said bearing sleeve while permitting linear, reciprocating motion of said shaft with respect to said bearing sleeve.

8. A linear bearing system in accordance with claim 7 wherein a flow of said gas through said grooves is proportional to the cube of the thickness of said gas film within an operating range thereof.

9. A linear bearing system in accordance with claim 7 further comprising a platen disposed within said high vacuum chamber to which is connected said high precision shaft, and wherein reciprocation of said high precision shaft with respect to said bearing sleeve means linearly moves said platen with respect to said high vacuum chamber.

10. A linear bearing system according to claim 9 wherein said shaft is generally vertically oriented and gravitationally counterbalances the effects of the pressure difference acting thereon when said chamber is substantially evacuated.

* * * * *